US011009621B2

(12) United States Patent
Wollin

(10) Patent No.: US 11,009,621 B2
(45) Date of Patent: *May 18, 2021

(54) APPARATUS AND METHOD FOR DIRECT ANALYSIS OF FORMATION COMPOSITION BY MAGNETIC RESONANCE WIRELINE LOGGING

(71) Applicant: Wollin Ventures, Inc., Sarasota, FL (US)

(72) Inventor: Ernest Wollin, Sarasota, FL (US)

(73) Assignee: WOLLIN VENTURES, INC., Sarasota, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/575,230

(22) Filed: Sep. 18, 2019

(65) Prior Publication Data

US 2020/0049852 A1 Feb. 13, 2020

Related U.S. Application Data

(63) Continuation of application No. 14/874,835, filed on Oct. 5, 2015, now Pat. No. 10,502,602.

(60) Provisional application No. 62/733,383, filed on Sep. 19, 2018, provisional application No. 62/060,321, filed on Oct. 16, 2014.

(51) Int. Cl.
*G01V 3/32* (2006.01)
*G01F 1/716* (2006.01)

(52) U.S. Cl.
CPC ............... *G01V 3/32* (2013.01); *G01F 1/716* (2013.01)

(58) Field of Classification Search
None
See application file for complete search history.

(56) References Cited

U.S. PATENT DOCUMENTS

| | | |
|---|---|---|
| 4,782,295 A | 11/1988 | Lew |
| 5,532,593 A | 7/1996 | Maneval et al. |
| 5,604,891 A | 2/1997 | Burnett et al. |
| 6,166,540 A | 12/2000 | Wollin |
| 6,452,390 B1 | 9/2002 | Wollin |
| 2003/0071617 A1* | 4/2003 | Kruspe .................... G01V 3/32 324/303 |
| 2006/0020403 A1 | 1/2006 | Pusiol |
| 2008/0174309 A1 | 7/2008 | Pusiol et al. |
| 2009/0251145 A1 | 10/2009 | Kaneko et al. |
| 2013/0181706 A1 | 7/2013 | Blanz et al. |

OTHER PUBLICATIONS

Balanis, C.A. "Advanced Engineering Electromagnetics", John Wiley & Sons, 1989, pp. 72-103.

(Continued)

*Primary Examiner* — Jermele M Hollington
*Assistant Examiner* — Suresh K Rajaputra
(74) *Attorney, Agent, or Firm* — Foley & Lardner LLP

(57) ABSTRACT

A wireline or logging while drilling device includes: a first coil configured to vary the intensity of a main magnetic field so as to produce phase modulation of signals emitted by spins in a sensitive volume; and a second coil configured to excite the spins in the sensitive volume in an inverse ratio of gyromagnetic constants of the spins; and receive signals from the spins displaced in frequency from the Larmor frequency of the spins by the phase modulation produced by the first coil.

5 Claims, 2 Drawing Sheets

(56) References Cited

OTHER PUBLICATIONS

Cho, Z. et al. "Foundations of Medical Imaging". John Wiley & Sons, Inc., New York, 1993, pp. 374-386.
Den Hartog, J.P. "Mechanics". McGraw Hill Book Co., 1948.; Dover Publications Inc. 1961, pp. 313-340.
Mansfield, P, et al. "NMR Imaging in Biomedicine"; Advances in Magnetic Resonance, Supplement 2; 1982; Academic Press, Inc., Orlando, pp. 234-239.
Poularikas, A.D., Ed. "The Transforms and Applications Handbook," CRC Press, 1996, pp. 221-222.
Slichter, C.P. "Principles of Magnetic Resonance". Third Edition, Springer-Verlog, 1989, Ch. 2, pp. 11-64.
Smythe, W.R. "Static and Dynamic Electricity". Second Edition. McGraw Hill Book Co, 1950, pp. 390-397.

\* cited by examiner

APPARATUS AND METHOD FOR DIRECT ANALYSIS OF FORMATION COMPOSITION BY MAGNETIC RESONANCE WIRELINE LOGGING

CROSS REFERENCE TO RELATED APPLICATIONS

This application is a continuation-in-part of application Ser. No. 14/874,835, filed Oct. 5, 2015, entitled "APPARATUS AND METHOD FOR MEASURING VELOCITY AND COMPOSITION OF MATERIAL IN AND ADJACENT TO A BOREHOLE," which claims priority to Provisional Application No. 62/060,321, filed Oct. 6, 2014, entitled "APPARATUS AND METHOD FOR MEASURING VELOCITY AND COMPOSITION OF MATERIAL IN AND ADJACENT TO A BOREHOLE," the disclosures of all of which are incorporated by reference herein in their entirety. Furthermore, this application claims priority to Provisional Application No. 62/733,383, filed Sep. 19, 2018, entitled "APPARATUS AND METHOD FOR DIRECT ANALYSIS OF FORMATION COMPOSITION BY MAGNETIC RESONANCE WIRELINE LOGGING," the disclosure of which is incorporated by reference herein in its entirety.

BACKGROUND OF THE INVENTION

This disclosure relates to the field of geological exploration, and in particular to apparatus and methods for continuous analysis of signals from magnetized geological formations by magnetic resonance wire line logging.

Continuous analysis of moving magnetized material by magnetic resonance creates periodic variation of the Larmor frequency of the moving magnetized material by modulating coils that periodically vary the main magnetic $B_0$ field strength. This periodically varies the impedance presented to the radio frequency oscillator power supply, which impedance function is a Lorentzian line. This methodology does not directly detect signals continuously emitted by the moving magnetized material.

Continuous creation and detection of signals emitted by moving magnetized material is disclosed by U.S. Pat. No. 6,452,390B1 to Wollin, and by the application of this technology to flow in a borehole environment disclosed in US 2016/0097664A1 to Wollin, both incorporated herein by reference for all purposes.

SUMMARY

The systems, methods and devices of this disclosure each have several innovative aspects, no single one of which is solely responsible for the desirable attributes disclosed herein.

In one embodiment described herein, a wireline or logging while drilling device includes: a first coil configured to vary the intensity of a main magnetic field so as to produce phase modulation of signals emitted by spins in a sensitive volume; and a second coil configured to excite the spins in the sensitive volume in an inverse ratio of gyromagnetic constants of the spins; and receive signals from the spins displaced in frequency from the Larmor frequency of the spins by the phase modulation produced by the first coil In another embodiment described herein, a flow measurement device for measuring flow in or around a borehole of an earth formation includes: a magnet configured to generate a static solenoidal magnetic field with a field intensity that decreases in strength peripherally from the magnet; an electromagnet disposed around the magnet and configured to generate a time varying solenoidal magnetic field; and a radio frequency (RF) coil disposed around the magnet and configured to: generate an RF magnetic field transverse to the static solenoidal magnetic field to activate spins of nuclides having a same gyromagnetic ratio in a region of interest around the flow measurement device; and receive radio frequencies corresponding to the gyromagnetic ratio.

This disclosure provides for, among other things, a device including a permanent magnet and coils that can identify producible hydrocarbons with high spatial resolution. This disclosure also provides for, among other things, a method for directly determining productive levels during hydrocarbon wire line well logging. The method may include direct detection of a continuous signal from carbon 13 as a surrogate for hydrocarbon, enabled by continuous phase modulated dual resonance excitation of both hydrogen protons and carbon 13 atoms in a formation deep to borehole effects, and may involve electronic and circuitry modification of wire line logging tools. Logging speed can be adjusted to discriminate against non-producible surface-associated hydrocarbon, solid hydrocarbon, bitumin, and viscous high density hydrocarbon as those compounds have short T2 spin spin dephasing. Thus, signals received from carbon 13 atoms would be from producible hydrocarbon.

Analysis of the motion of an isolated spin, as described more completely below, yields an elliptic integral of the first kind which is not integrable in closed form. However, look-up tables may be used to provide the value of the integral for each value of the colatitude (flip angle) and each value of the periodic phase angle. The continuous reception of a signal with a known periodic phase angle phase modulates the emitted signal and provides the continuously detected continuously emitted signal with an extremely narrow bandwidth, markedly limiting Johnson-Nyquist noise, at known sideband frequencies displaced from the applied $B_1$ radio frequency field permitting continuous detection of the emitted signal in the presence of the applied constant frequency $B_1$ field by cross-correlation with those known frequencies.

The sine of the colatitude ("flip angle") of the magnetization is the coefficient of the detectable amplitude of the emitted signal. In embodiments disclosed herein, this detectable amplitude is adjustable by the amplitude of the applied radio frequency $B_1$ field, and by the logging speed. The geometry of the applied radio frequency $B_1$ field defines the spatial resolution of the logging volume (vide infra).

The amplitude of the continuously received continuously emitted signal is a function of the quantity of magnetized material in the logging volume V (vide infra). The use of dual radio frequency coils permits detection of signal from low sensitivity low signal strength magnetized material by double resonance.

The logging tool can include a magnet configured to generate a static solenoidal magnetic field with a field intensity that decreases in strength peripherally from the magnet. The logging tool can include an electromagnet disposed around the magnet and configured to generate a similar but time varying solenoidal magnetic field. The logging tool can include one or more radio frequency (RF) coils disposed around the magnet. Dual RF coils can be configured to enable detection of signals from low sensitivity low signal strength magnetized material by double resonance.

In some implementations, the logging tool can include a controller configured to calculate the prevalence of selected nuclides in the logging volume V (vide infra) around the logging tool based on the received signal. In some implementations, the volume of interest can be a region in or around a borehole in an earth formation.

Embodiments of the method disclosed can include inserting the magnetic resonance logging tool into the borehole in the earth formation, the logging tool comprising a magnet, an electromagnet disposed around the magnet, and radio frequency (RF) coils disposed around the magnet. The method can include generating, using the magnet, a static solenoidal magnetic field, wherein the static solenoidal magnetic field has a field intensity that decreases in strength peripherally from the magnet. The method can include generating, using the electromagnet, a similar but weak time varying solenoidal magnetic field. The method can include generating, using the RF coils, an RF magnetic field transverse to the static solenoidal magnetic field and rotating at a Larmor radio frequency corresponding to the solenoidal field intensity in the logging volume V (vide infra) around the logging tool. The method can include receiving a signal induced in the RF coils by a magnetic field around the RF coils.

In some implementations, the method can include calculating the prevalence of selected nuclides in the logging volume V (vide infra) around the logging tool based on the received signals.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figures 1A, 1B:
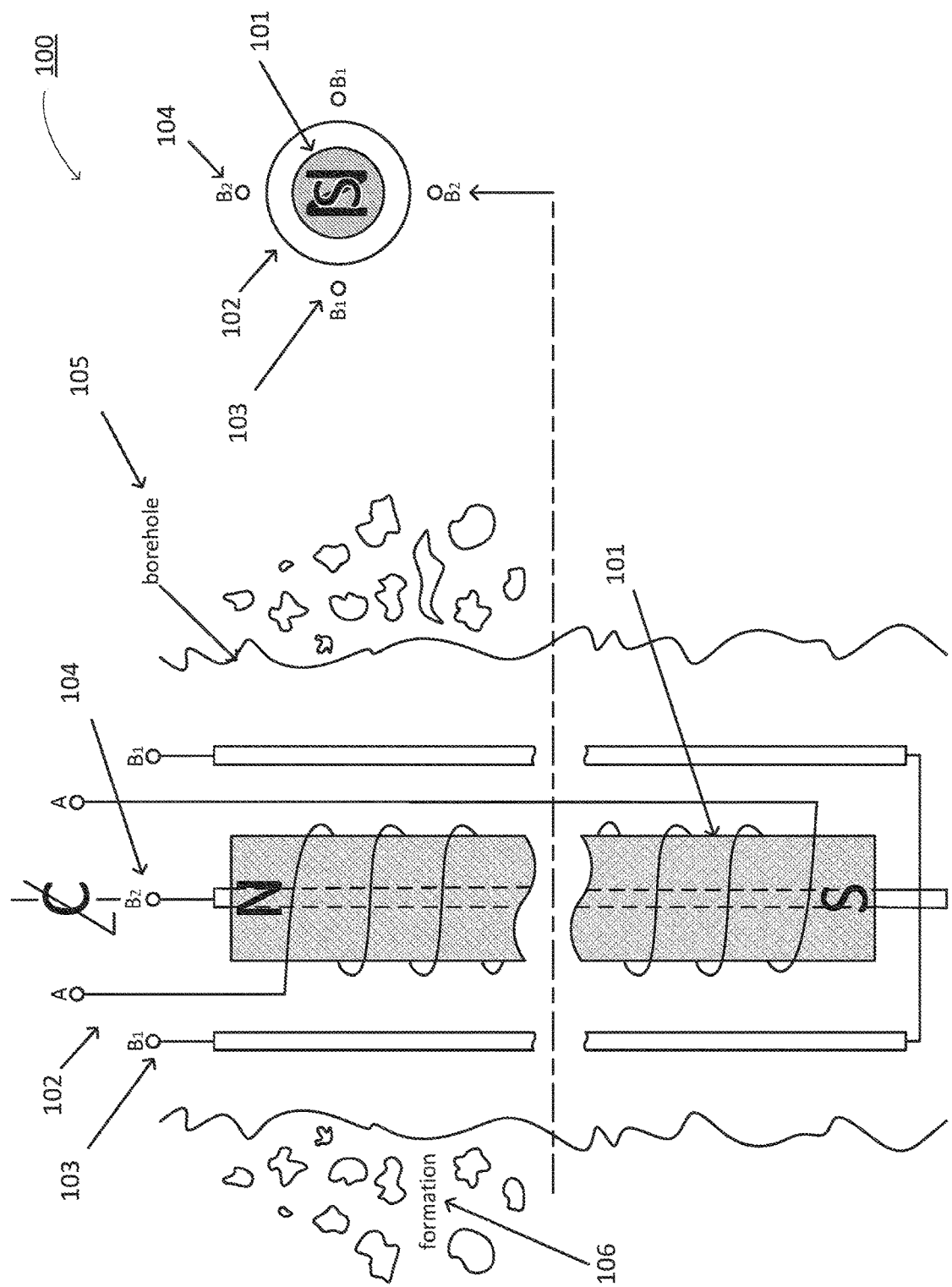
FIGS. 1A and 1B show a cross-sectional side view and top view of an example embodiment of a magnetic resonance logging tool.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that is capable of measuring nuclide composition of magnetized material.

The following disclosure pertains to measuring nuclide composition of material within a borehole or peripherally in a surrounding formation. The borehole may be present in an earth formation or a man-made structure. The borehole may contain a logging tool employing nuclear spin or electron spin magnetic resonance for measurement. Applications of the logging tool disclosed herein include, without limitation, hydrocarbon production, hydraulic fracturing, groundwater migration, contaminant diffusion, or detecting formation migration or tectonic plate shift.

Transient response of spin systems have usually been described by solutions to the Bloch equations which describes the magnetization as a function of both the applied magnetic fields and the relaxation effects on a phenomenological basis. Solutions to the Bloch equations require assumptions about the magnitude of these parameters and prescription of boundary conditions, creating a differential system applicable to a particular set of circumstances. To simplify this process further, the description below begins with the equation of motion of an isolated spin, modeled as gyroscopic precession creating a magnetic moment which interacts with moments created by applied magnetic fields, then introduces the total magnetization as a function of spin density, and finally limits the applicability of the equations so derived by the relationship between the times of the event sequence to the relaxation times. It is noted that non-producible hydrocarbons in general have much shorter relaxation times than producible hydrocarbons. Short T2, non-producible hydrocarbons are solid or highly viscous with signals that extinguish rapidly. Signals from long T2, less viscous producible hydrocarbons can be accentuated by adjusting logging speed. Formation permeability can be demonstrated directly by observing flow rather than empirically estimated.

A device (e.g. a wireline or logging while drilling device) can include at least two coils. A first coil (e.g. the coil 102 shown in FIG. 1A and FIG. 1B) can be configured to slightly vary a main magnetic field produced by a permanent magnet of the device, and a second coil (e.g. the coil 103 shown in FIG. 1A and FIG. 1B) can include at least one RF coil configured to produce two RF fields of intensity in the inverse proportion of the gyromagnetic ratios of the excited spins in the sensitive volume of interest, and to receive signals from these spins slightly displaced from the Larmor frequency of these spins by the phase modulation produced by the first coil.

Gyroscopic Precession

A rigid body free in space without any constraints can rotate permanently only about a principal axis of inertia". If a rigid body rotates with speed $\omega_1$ about a principal axis of inertia, and with $\omega_2=\omega_3=0$ about the other two principal axes, then the angular momentum vector (i.e. moment of momentum vector) $\vec{M}$ has the same direction as the angular-speed vector $\vec{\omega}_1$ (which is along the axis of rotation). Angular velocities of a rigid body about various axes in space, all intersecting in a point, can be compounded vectorially into a resultant angular speed about THE axis of rotation.

We infer from the last statement that the resultant angular speed $\omega_1$ about THE axis of rotation taken as the resultant angular velocity Co' can be decomposed into a vector sum of angular velocities $\Sigma \vec{\omega}_n$. Further, taking the rigid body as having mass symmetrically distributed about all axes through the center of mass yields a constant scalar moment of inertia $I_0$ about all axes, leading to the desired result decomposing the angular momentum vector $\vec{M}$:

$$\vec{M} = I_0 \vec{\omega} = \sum_n I_0 \vec{\omega_n}$$

From Newton's equations, with $\vec{M_G}$ being the moment of external forces about the center of mass:

$$\vec{M}_G = \frac{d}{dt} I_0 \vec{\omega} = \sum_n \frac{d}{dt} I_0 \vec{\omega_n}.$$

Thus the vector sum of the moments of a set of external forces $\Sigma \vec{M_{Gn}}$ equals the time rate of change of the total angular momentum $I_0 \vec{\omega}$, i.e:

$$\vec{M}_G = \sum_n \vec{M_{Gn}} = \frac{d}{dt} I_0 \vec{\omega} = \sum_n \frac{d}{dt} I_0 \vec{\omega_n}.$$

Gyromagnetic Ratio

Taking the rigid body as having a symmetrical distribution of charge about the center of mass creates a magnetic moment $\vec{\mu}$ about any axis of rotation proportional to the angular velocity $\vec{\omega}$ about that axis of rotation where each element of charge dq at distance r from the axis of rotation creates an element $d\vec{\mu}$ of this magnetic moment $\vec{\mu}$ where, by definition of the magnetic moment, $$d\vec{\mu} = (\pi r^2)(r\vec{\omega}) \frac{dq}{2\pi r}$$

Each element of mass dw at distance r from this axis of rotation creates an element of the angular momentum (moment of momentum) dM of $$d\vec{M} = (r)(r\vec{\omega}) dw.$$

The ratio is assumed to be a constant:

$$\frac{d\vec{\mu}}{d\vec{M}} = \frac{1}{2} \left( \frac{dq}{dw} \right) \equiv \gamma$$

$\gamma$ being a scalar constant termed the gyromagnetic ratio. Integrating, with boundary condition $\vec{\mu} = 0$ when $\vec{M} = 0$ yields:

$$\vec{\mu} = \gamma \vec{M}.$$

General Equation of Motion of an Isolated Spin

A magnetic moment $\vec{\mu}$ subjected to a field of magnetic induction $\vec{B}$ will experience a mechanical moment (torque) $\vec{M}_G$ such that:

$$\vec{M}_G = \vec{\mu} \times \vec{B}$$

In free space of permeability $\mu_0$, the magnetic induction $\vec{B}$ is proportional to the magnetic field intensity $\vec{H}$:

$$\vec{B} = \mu_0 \vec{H}$$

Equating the rate of change of the angular momentum to the applied mechanical moment (torque) yields $$\vec{\mu} \times \vec{B} = \frac{d}{dt} \vec{M}.$$

Multiplying by the gyromagnetic ratio $\gamma$ and substituting $\vec{\mu} = \gamma \vec{M}$ and $B = \mu_0 \vec{H}$ yields $$\vec{\mu} \times (\gamma \mu_0) \vec{H} = \frac{d}{dt} \vec{\mu}.$$

Defining $\gamma' = \gamma \lambda_0$ yields the equation of motion of a magnetic moment (spin) subjected to a magnetic field intensity $\vec{H}$:

$$\vec{\mu} \times \gamma' \vec{H} = \frac{d}{dt} \vec{\mu}.$$

Dividing by $\mu$ yields the instantaneous angular velocity of a magnetic moment (spin) $\vec{\mu}$ subjected to a time varying ambient magnetic field intensity $\vec{H}$:

$$\vec{I}_\mu \times \gamma' \vec{H} = \frac{d}{dt} \vec{I}_\mu,$$

which is a linear differential equation with constant coefficients, allowing superposition.

Decomposing $\vec{H}$ into $H_0$, $h_p$, and $h_n$

Define an orthogonal coordinate system for $\vec{I}_\mu$ and $\vec{H}$ as $\vec{z}$, $\vec{x}$, $j\vec{y}$ where $\vec{x} + j\vec{y}$ forms Gaussian planes everywhere orthogonal to $\vec{z}$. This allows decomposition of the ambient magnetic field intensity $\vec{H}$ such that:

$$\vec{H} = [H_0 + h_p \cos(\Omega t)] \vec{z} + \vec{h_n} e^{j\gamma' H_0 t},$$

where $H_0$ is a strong non-time variant ambient magnetic field intensity, $h_p$ is co-aligned with $H_0$ and sinusoidally periodic at frequency $\Omega$, and $h_n$ is everywheres orthogonal to $H_0$ rotating in the local orthogonal $\vec{x}, j\vec{y}$ Gaussian plane at angular velocity $\gamma \mu_0 H_0 = \gamma B_0 = \omega_0$, which is the Larmor frequency.

Equation of Motion

Substituting and Rearranging in Differential Form $$d\vec{I}_\mu = (\vec{I}_\mu \times \gamma' H_0 \vec{z}) dt + (\vec{I}_\mu \times [\gamma' h_p \cos(\Omega t)] \vec{z}) dt + (\vec{I}_\mu \times \gamma' \vec{h_n} e^{j\gamma' H_0 t}) dt$$

since the vector product (cross product) distributes across a vector sum.

The first term creates a constant precession of $\vec{I}_\mu$ of angular velocity $\gamma' H_0$ about the $\vec{z}$ axis.

The second term creates a periodic precession of $\vec{I}_\mu$ of peak angular velocity $\gamma' h_p$ and temporal frequency $\Omega$ about the $\vec{z}$ axis.

The third term represents a precession of $\vec{I}_\mu$ of angular velocity $\gamma' h_n$ about an axis perpendicular to the $\vec{z}$ axis, said axis rotating with angular velocity $\gamma' H_0$ in the $\vec{x} + j\vec{y}$ Gaussian plane, a periodic Bloch-Siegert effect.

These three instantaneous angular velocities add vectorially to a resultant angular velocity, which when integrated over time, creates the locus of $\vec{I}_\mu$ in space.

If $\gamma' h_n \ll \gamma' h_p \ll \gamma' H_0$, the locus of the unit vector $\vec{I}_\mu$ describes a serpiginous line of colatitude $\theta$ and longitude $\varphi$ on a unit diameter sphere, said sphere rotating with an angular velocity $\gamma'H_0$ in the local $\vec{x}+j\vec{y}$ Gaussian plane. The rate of increase of $\theta$ is maximum at the poles ($\theta=0, \pi$) and decreases at mid-latitude to 0.340 of maximum at the equator ($\theta=\pi/2$). The governing equations are:

$$\vec{1}_u X \gamma' \vec{h'_n} \triangleq \vec{\omega}_n = \frac{d\vec{\theta}}{dt} = \vec{1}_u[\cos^2\theta + \sin^2\theta\cos^2\varphi]^{\frac{1}{2}} X \gamma' \vec{h}_n$$

$$\vec{1}_u X \gamma' \vec{h}_p \cos\Omega t = \vec{\omega}_p = \frac{d\vec{\varphi}}{dt} = \vec{z}\gamma' h_p \cos\Omega t$$

$$\vec{\varphi} = \int \vec{\omega}_p dt = \frac{\gamma'}{\Omega}\sin\Omega t; \frac{\gamma' h_p}{\Omega} \cong 1.8, \text{ to maximize } J_1 \text{ (vide infra)}.$$

$$h'_n \triangleq h_n\left[\cos^2\theta + (\sin^2\theta)\left[\cos^2\left(\frac{\gamma' h_p}{\Omega}\sin\Omega t\right)\right]\right]^{\frac{1}{2}}$$

As $\theta \to (0, \pi); h'_n \to h_n$ $$\gamma' h'_n \triangleq \gamma' h_n\left[1 - \sin^2\theta\left[1 - \cos^2\left(\frac{\gamma' h_p}{\Omega}\sin\Omega t\right)\right]\right]^{\frac{1}{2}}.$$

$$\frac{d\theta}{dt} = \gamma' h_n\left[1 - \sin^2\theta\sin^2\left(\frac{\gamma h_p}{\Omega}\sin\Omega t\right)\right]^{\frac{1}{2}}$$

$$\int_0^\tau \gamma' h_n dt = \int_0^\theta \left[1 - \sin^2\theta\sin^2\left(\frac{\gamma' h_p}{\Omega}\sin\Omega t\right)\right]^{-\frac{1}{2}} d\theta$$

$$\gamma' h_n \tau = \int_0^\theta [1 - \sin^2\theta\sin^2\varphi]^{-\frac{1}{2}} d\theta$$

$$\gamma' h_n \tau \triangleq F(\theta \backslash \varphi)$$

which is an incomplete elliptic integral of the first kind with a periodic modular angle, and is not integrable.

Output Voltage in Receiver Coil

Based on the foregoing, continuous analysis of signals from magnetized materials may be achieved. The continuous reception of a signal with a periodic frequency phase modulates the continuously emitted signal and provides the continuously detected continuously emitted signal with an extremely narrow bandwidth, markedly limiting Johnson-Nyquist noise, at known sideband frequencies displaced from the applied $B_1$ radio frequency field permitting continuous detection of the emitted signal in the presence of the applied constant frequency $B_1$ field.

The sine of the colatitude ("flip angle") of the magnetization is the coefficient of the detectable amplitude of the emitted signal. This detectable amplitude is adjustable by the amplitude of the applied radio frequency $B_1$ field, which detectable amplitude becomes a function of the known logging speed and of the unknown prevalence of the magnetized nuclide in the logging volume V (vide infra).

The amplitude of the continuously received continuously emitted signal is a function of the quantity of magnetized material in the logging volume V (vide infra). The use of dual radio frequency coils permits detection of signal from low signal strength low sensitivity magnetized material utilizing the Hartmann-Hahn ratio. Applying double resonance frequencies $h_{n_1}$ and $h_{n_2}$ to nuclides of gyromagnetic ratio $\gamma_1$ and $\gamma_2$ respectively in the same logging volume V (vide infra) during logging volume dwell time t with the condition of maximum energy transfer from $h_{n_1}$ and $h_{n_2}$ to the output signal (vide infra) $\gamma_1 h_{n_1} t = \gamma_2 h_{n_2} t = \pi$ leads directly to the Hahn-Hartman ratio $$\frac{\gamma_1}{\gamma_2} = \frac{h_{n_2}}{h_{n_1}}.$$

This is explained further as follows:

If the transverse magnetization $\vec{\mu}_T$ is defined as the projection of the magnetic moment $\vec{\mu}$ on the $\vec{x}+j\vec{y}$ Gaussian plane, which plane is transverse to the $\vec{z}$ axis, such that:

$$\vec{\mu}_T = (\vec{\mu} \sin\theta)e^{j\varphi},$$

where $\theta$ is the colatitude of $\vec{\mu}$ with respect to the $\vec{z}$ axis, and $\varphi$ is the longitude taken from a zero meridian through the $\vec{z}$ and $j\vec{y}$ axes, the instantaneous angular velocity of $\vec{u}_T$ in the $\vec{x}+j\vec{y}$ Gaussian plane then is:

$$\vec{\omega}_T = (\gamma' h_p \cos(\Omega t) + \gamma' H_0)\vec{z}$$

creating a phase incrementation $\varphi$ of $\vec{\mu}_T$ at time t of $$\vec{\varphi} = \int_0^\tau \vec{\omega}_T dt = \left(\frac{\gamma' h_p}{\Omega}\sin(\Omega t) + \gamma' H_0 t\right)\vec{z}.$$

A coil of N turns will subtend the rotating magnetization of $\vec{\mu}_T$ such that:

$$\mu_c = \mu\sin\theta(\sin\varphi) = (\mu\sin\theta)\sin\left[\frac{\gamma' h_p}{\Omega}\sin(\Omega t) + \gamma' H_0 t\right].$$

By Faraday's law, the voltage induced in the coil is $$V_c = N\mu_0 \frac{d\mu_c}{dt} =$$

$$N\mu_0\left((\mu\sin\theta)(\gamma' h_p\cos(\Omega t) + \gamma' H_0)\left(\cos\left[\frac{\gamma' h_p}{\Omega}\sin(\Omega t) + \gamma' H_0 t\right]\right) + \right.$$

$$\left. \sin\left[\frac{\gamma' h_p}{\Omega}\sin(\Omega t) + \gamma' H_0 t\right](\mu\cos\theta)\left(\frac{d\theta}{dt}\right)\right)$$

Since $\frac{d\theta}{dt} \leq \gamma' h_n \ll \gamma' h_p \ll \gamma' H_0$:

$$V_c \cong N(\mu_0\mu\sin\theta)(\gamma' H_0)\left(\cos\left[\frac{\gamma' h_p}{\Omega}\sin(\Omega t) + \gamma' H_0 t\right]\right),$$

where N is the number of turns in the coil, $\mu_0$ is the permeability of free space, $H_0$ is the main magnetic field intensity, $\gamma'$ is the gyromagnetic ratio $\mu_0\gamma$, $h_p$ is the peak magnetic field intensity of the phase modulating field of temporal frequency $\Omega$, and $\theta$ is the colatitude of the magnetic moment (spin) of magnetic field intensity $\mu$.

The Fourier transform of $V_c$ with respect to time is $$\mathfrak{J}V_c|_\omega = \pi A \sum_{n=-\infty}^{+\infty}\left[J_n\left(\frac{\gamma' h_p}{\Omega}\right)\delta_{[\omega-(\gamma' H_0+n\Omega)]} + J_n\left(\frac{\gamma' h_p}{\Omega}\right)\delta_{[\omega+(\gamma' H_0+n\Omega)]}\right],$$

where $A = N(\mu_0\mu)(\mu_0 H_0)\gamma\sin\theta$.

Phase Modulating Field

Three voltages are induced in the receiver coil; the first by $h_p$ at a low frequency $\Omega$, the second by $h_n$ of radio frequency (RF) frequency $\gamma'H_0=\gamma\mu_0 H_0=\gamma B_0=\omega_0$, and the third by the precession of the magnetic moment $\vec{\mu}$ (spin) consisting of a central frequency $\omega_0$ with an infinite number of sidebands spaced about this central RF Larmor frequency $\omega_0$ at frequency intervals $\Omega$. These sidebands permit adjustment of $h_n$ for the maximum output voltage in the receiver coil since they can be detected in the presence of the applied Larmor RF frequency $\omega_0$ and the applied phase modulating low frequency $\Omega$ by rejecting these latter frequencies with circuit filters or lock-in amplifiers and/or by detection, heterodyning, and homodyne demodulation techniques employed in prior art radio receivers. The preferred first sideband voltage is maximized if the argument of the first sideband is adjusted so that:

$$J_1\left(\frac{\gamma' h_p}{\Omega}\right) \cong J_1(1.8) \cong 0.582 (\text{Abramowitz, op. cit. p. 390})$$

Yielding $$\Omega = \frac{\gamma' h_p}{1.8} = \frac{\gamma \mu_0 h_p}{1.8} = \frac{\gamma b_p}{1.8} = \frac{2\pi(42.589 \times 10^6)}{1.8} \cdot b_p,$$

then the side band frequency $f_p \cong 23.6 \times 10^6 \cdot b_p$ where $2\pi f_p = \Omega$. The peak excursion of the magnetic moment (spin) from the plane containing $H_0$ and orthogonal to $h_n$ is $\pm 1.8$ radians, or $\pm 103$ degrees.

Thus, $\Omega$ and $h_p$ are so defined but are independent of the main magnetic field strength $H_0$ or Larmor frequency $\gamma' H_0 = \gamma \mu_0 H = \gamma B_0 = \omega_0$.

WireLine Logging Application

If the magnetic moments (spins) $\vec{\mu}$ dwell in a space containing $H_0$ and $h_p$ for a time sufficient to create significant magnetic field intensity (Slichter, op. cit. Ch.2.11, p. 51) and then dwell in a space additionally containing $h_n$ for a dwell time such that nutation occurs through an angle $\theta = \pi$, maximum energy is absorbed by the magnetic moments (spins) $\vec{\mu}$ from $h_n$.

A medium (lattice) containing a distribution of magnetic moments $\vec{\mu}$ (spins) of dwell time t in a space in which these magnetic moments are subjected to both a strong static magnetic field intensity $\vec{H}_0$ and co-aligned weak component $h_p$, sinusoidally varying with a frequency $\Omega$, will absorb energy from the magnetic moments by first order kinetics, opposed by random thermal motion, creating a magnetic field intensity $\vec{m}$ such that $$\vec{m} \hat{X}(\vec{H}_0 + \vec{h}_p \cos \Omega t)(1 - e^{-t/T_1}),$$

(where $\hat{}$ denotes both spatial vector and temporal phasor), $\hat{X}$ being the complex susceptibility, $T_1$ the spin-lattice relaxation.

The logging volume V is the space occupied by the magnetic fields $H_0$, $h_p$, and $h_n$, as all previously defined. If the spins occupy the volume V for the time $\tau$ the volume logging rate is $V/\tau$. After a time $\tau$ the spins in the logging volume are at colatitude ("flip" angle) $\theta$ and phase angle $\varphi$ as governed by $\gamma' h_n \tau = F(\theta \dagger \varphi)$. Then $$\frac{V}{\tau} = \gamma' \frac{h_n}{F(\theta \backslash \varphi)} V$$

The detectable transverse magnetization is $M = \int_0^\theta m \sin \theta \, d\theta$, $M = (1 - \cos \theta)$. For maximum M, $$\frac{dM}{d\theta} = m \sin \theta = 0; \theta = n\pi. \quad F(\pi \backslash \varphi) = 2F(\pi/2 \backslash \varphi) = 2K$$

K is a complete elliptic integral of the first kind. $\varphi$ is the modular angle. $\varphi$ is periodic, $$\varphi = \frac{\gamma h_p}{\Omega}$$

$\sin \Omega t$, a formulation not treated elsewhere.

$$K \triangleq \int_0^{\pi/2} [1 - (\sin^2 \varphi)(\sin^2 \theta)]^{-1/2} d\theta$$

$$\text{if } \frac{d\theta}{dt} \ll \Omega, \text{ then} \frac{d\theta}{d\varphi} \cong o. \quad \sin^2 \varphi = 1 - \cos^2 \varphi \triangleq m.$$

$$\cos \varphi \stackrel{m}{=} \frac{1}{2\pi} \int_{-\pi}^{+\pi} \cos\left(\frac{\gamma h_p}{\Omega} \sin \Omega t\right) d(\Omega t) = \frac{1}{\pi} \int_0^\pi \cos\left(\frac{\gamma h_p}{\Omega} \sin \Omega t\right) d(\Omega t)$$

$$\text{But } J_n(z) = \frac{1}{\pi} \int_0^\pi \cos(z \sin \varphi - n\varphi) d\varphi; \text{ (Bessel)}$$

$$J_0\left(\frac{\gamma h_p}{\Omega}\right) = \frac{1}{\pi} \int_0^\pi \cos\left(\frac{\gamma h_p}{\Omega} \sin \Omega t\right) d(\Omega t)$$

$$m = 1 - J_0^2(1.8) = 1 - (.340)^2 = .884;$$

$$K = \int_0^{\pi/2} [1 - .884 \sin^2 \theta]^{-1/2} d\theta = 2.5$$

$$V/\tau = \left[\frac{\gamma'}{2(2.5)}\right] V h_n = \left[\frac{\gamma}{2(2.5)}\right] V b_n = \left[\frac{2\pi(42.6 \times 10^6)}{2(2.5)}\right] V b_n \text{ Tesla}$$

$$V/\tau = 53.5 \times 10^6 V b_n \text{ Tesla} = 535 \times 10^9 V b_n \text{ Gauss}$$

Exemplary Magnetic Resonance Well Logging Tool

With this background, a logging tool implementing these principles can be designed.

FIGS. 1A and 1B show a cross-sectional side view and top view, respectively, of an example embodiment of a magnetic resonance well logging tool 100. The tool 100 includes a magnet 101 having north and south poles, an electromagnet 102, and radio frequency ("RF") coils 103 and 104. The tool 100 is configured to insert into a borehole 105 of an earth formation 106 suspended by a wireline and withdrawn creating relative motion between the tool and the formation.

The tool 100 can include a magnet 101. The magnet 101 can generate a static magnetic field around the flow measurement device 100 that is generally solenoidal in shape. The strength of the static magnetic field generated by magnet 101 can decrease in strength peripherally from the magnet. The magnet 101 can be a permanent magnet. The magnet 101 can be of any size or shape appropriate to the dimensions of the borehole and the measurement application for which it will be used, including a long cylindrical shape.

The logging tool 100 can include an electromagnet 102. The electromagnet 102 can be configured to generate a time varying magnetic field around the tool 100 that is generally solenoidal in shape. The electromagnet 102 can be of any type suitable for generating a solenoidal magnetic field of roughly the same relative distribution as the static magnetic field. The electromagnet 102 can take the shape of a helical coil surrounding the magnet 101. The strength of the time varying magnetic field generated by the electromagnet 102 can vary linearly with the application of a time varying current through the electromagnet 102. The strength of the time varying magnetic field generated by the electromagnet 102 can be relatively weak compared to the strength of the static magnetic field; for example, a fraction of a Gauss to several Gauss compared to several thousand Gauss in the static magnetic field. The frequency of the time varying magnetic field generated by the electromagnet 102 can be very low compared to the frequency of the RF magnetic field generated by the RF coils 103 and 104.

The tool 100 can include radio frequency ("RF") coils 103 and 104. The RF coils can be configured to continuously generate a time varying magnetic field $h_n$ transverse to the $H_0$ static solenoidal magnetic field generated by the magnet 101. The RF coils 103 and 104 can be a single coil or made up of multiple coils. The RF coils 103 and 104 can be a single coil configured to continuously both create and receive signals from time varying magnetic fields. Alternatively, separate RF coils 103 and 104 can be employed continuously as a transmit coil and a receiving coil, respectively. The RF coils 103 and 104 can be of a birdcage or quadrature design, or any other coil, cage, or antenna structure suitable for directing an RF magnetic field outward from the tool 100. In one embodiment, the RF coils 103 and 104 comprise a transmitting birdcage coil disposed around the magnet and configured to continuously generate the RF magnetic field, and a receiving birdcage coil disposed around the magnet and configured to continuously output the received signal. In another embodiment, the RF coils 103 and 104 could comprise a first birdcage coil disposed around the magnet and configured to operate at a first frequency, and a second birdcage coil disposed around the magnet and configured to operate at a second frequency. The RF coils 103 and 104 can be tuned to resonate at the desired frequency of operation. The RF coils 103 and 104 can have a high quality factor ("Q") for improved efficiency of transmission and receipt of time varying magnetic fields. The RF coils 103 and 104 generate a time varying $h_n$ magnetic field rotating at the Larmor frequencies of the selected nuclides (e.g. H1 and C13), $\omega_0 = \gamma h_0$ corresponding to the $H_0$ static solenoidal magnetic field intensity $h_0$ in the logging volume V around the logging tool 100 in the ratio of the gyromagnetic constants of the selected nuclides. The logging volume V can take the shape of a segment of a barrel shaped prolate or oblate ellipsoidal surface having a finite thickness generated about the centerline of the logging tool 100. The RF coils 103 and 104 can be configured to output received signals induced by the magnetic fields about the RF coils 103 and 104.

Multiple RF coils 103 and 104 can be employed to measure the relative abundance of two different nuclides in the logging volume V; for example, detection and measurement of both $^1H$ and $^{13}C$ by the same tool 100 in the same logging volume V. Exciting RF coils 103 and 104 with frequencies selected for two different nuclides permits implementation of double resonance yielding the prevalence of, e.g., $^1H$ and $^{13}C$, thereby implementing a multiphase "cut meter" or wireline logging modality. Such a system may be valuable, for example, for measuring the relative abundance of hydrocarbons versus brine in the logging volume V surrounding the tool. Such information can be valuable when searching for, e.g. hydrocarbon deposits.

In operation, the magnet 101 and electromagnet 102 can create a strong solenoidal field with a very weak slowly time varying component in the borehole 105 and in the surrounding invaded and non-invaded earth formation 106 beneath any mudcake. The RF coils 103 and 104 can create an adjustable RF magnetic field essentially orthogonal to the solenoidal field. The RF magnetic fields rotate at the Larmor frequency and causes the spins to nutate with increasing colatitude angle with respect to the strong magnetic field, permitting reception of signal induced by a magnetic field created by the nutating spins at sideband frequencies displaced from the applied Larmor frequencies. Selecting the Larmor frequency selects the depth of investigation, where the depth of investigation represents the distance from the tool 100 to the region of interest of spin activation about the logging tool. That is, for a given strength of the static solenoidal magnetic field $H_0$, adjusting the frequency of the RF magnetic field generated by the RF coils 103 and 104 controls at what distance from the tool 100 spins of the same gyromagnetic ratio will be affected. An RF magnetic field having a higher frequency will activate spins of the same gyromagnetic ratio relatively closer to the logging tool 100, and an RF magnetic field having a lower frequency will activate spins of the same gyromagnetic ratio relatively further from the tool 100. The strength of the slowly varying component of the solenoidal field is adjusted for optimum signal reception of the preferably first sideband frequencies from the depth of investigation.

The conditions generated by the tool 100 create both nutation, with increasing co-latitude (flip angle), and periodic phase modulation of the rotational Larmor frequency of the spins. The received signal then induced in the RF coils 103 and 104 is sinusoidal with slowly varying frequency whose Fourier transform yields a central Larmor frequency and discrete side bands displaced by the phase modulation frequency. These side bands can then be detected in the presence of the strong continuous applied Larmor excitation frequency field by means known in the art including heterodyne frequency shift, homodyne detection, and cross correlation in a lock-in amplifier. Adjusting the strength of the applied Larmor excitation frequency field $B_1$ for maximum received signals yield a function of the prevalence of the spins and of the logging speed of the selected nuclides at the depth of investigation in the logging volume V.

The radio frequencies supplied to each coil 103 and 104 are in the frequency ratio of the gyromagnetic ratios of the detected nuclides to excite the same logging volume. These frequencies can be chosen so that the logging volume so selected is peripheral to borehole effects. The amplitude of each supplied radio frequency is inversely proportional to the gyromagnetic ratios of the detected nuclides to permit cross excitation of the less prevalent by the more prevalent nuclide by an appropriate resonance technique (the Hahn-Hartmann effect is a non-limiting example of such a technique). The amplitudes of these supplied radio frequencies are adjusted to produce maximum signal to account for variations in logging speed. The current in electromagnet 102 can be adjusted to maximize the value of the preferably first side band about the Larmor frequencies from the received signals induced in the RF coils 103 and 104.

Figure 2:
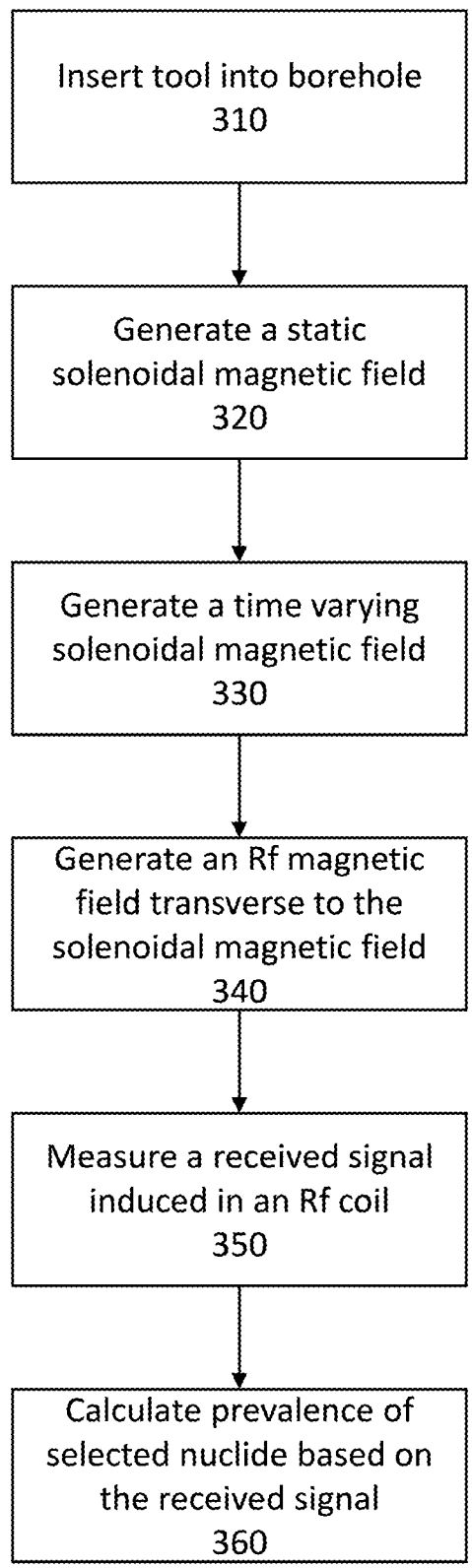
FIG. 2 shows a flow diagram of an example method for measuring a nuclide prevalence in or around a borehole in an earth formation.

FIG. 2 shows a flow diagram of an example method for measuring prevalence of selected nuclides in or around a borehole in an earth formation, using the techniques described above. In block 310, a tool or device (e.g. a wireline or logging while drilling device described herein) is inserted into a borehole. In block 320, the device generates a static solenoidal magnetic field. In block 330, the device generates a time varying solenoidal magnetic field. In block 340, the device generates an RF magnetic field transverse to the solenoidal magnetic field. This field may, for example, excite spins in a sensitive volume in an inverse ratio of gyromagnetic constants (e.g. gyromagnetic ratios) of the spins. In block 350, the device may measure a received signal induced in an RF coil of the device. The received signal may be, for example, from the spins, and may be displaced in frequency from the Larmor frequency of the spins by the phase modulation produced by the electromagnet. The received signal may, for example, have a radio frequency corresponding to the gyromagnetic ratio.

The foregoing disclosure is equally applicable to nuclear and electron magnetic resonance. Furthermore, the measurement of prevalence of nuclides by the device described in this disclosure is applicable not only to liquid or gas, but to other materials, such as mixtures, slurries, aggregates, blowing particles, viscous plastics as well as to solid materials.

Preferred embodiments of the invention have now been described. It will be appreciated by those skilled in the art that such embodiments are intended to exemplify the invention. Various other embodiments of the invention will be apparent, which fall within the spirit and scope of the invention.

What is claimed is:

1. A wireline or logging while drilling device, comprising:
   a first coil configured to vary the intensity of a main magnetic field so as to produce phase modulation of signals emitted by spins in a sensitive volume; and
   a second coil configured to:
      excite the spins in the sensitive volume in an inverse ratio of gyromagnetic constants of the spins; and
      receive signals from the spins displaced in frequency from the Larmor frequency of the spins by the phase modulation produced by the first coil.

2. A flow measurement device for measuring flow in or around a borehole of an earth formation, comprising:
   a magnet configured to generate a static solenoidal magnetic field with a field intensity that decreases in strength peripherally from the magnet;
   an electromagnet disposed around the magnet and configured to generate a time varying solenoidal magnetic field; and
   a radio frequency (RF) coil disposed around the magnet and configured to:
      generate an RF magnetic field transverse to the static solenoidal magnetic field to activate spins of nuclides having a same gyromagnetic ratio in a region of interest around the flow measurement device; and
      receive radio frequencies corresponding to the gyromagnetic ratio.

3. The flow measurement device of claim 1, wherein the second coil is configured to excite frequencies in the frequency ratio of the gyromagnetic ratio.

4. The flow measurement device of claim 1, wherein the second coil is configured to supply frequencies having an amplitude that is inversely proportional to the gyromagnetic ratio.

5. The flow measurement device of claim 1, wherein the second coil is configured to excite spins of a first nuclide and a second nuclide.

* * * * *